United States Patent [19]
Gottschalk

[11] Patent Number: 4,874,450
[45] Date of Patent: Oct. 17, 1989

[54] LAMINATING TRANSPARENT OR TRANSLUCENT MATERIALS USING IONIC DYE-COUNTER ION COMPLEXES

[75] Inventor: Peter Gottschalk, Centerville, Ohio

[73] Assignee: The Mead Corporation, Dayton, Ohio

[21] Appl. No.: 220,363

[22] Filed: Jul. 11, 1988

Related U.S. Application Data

[63] Continuation of Ser. No. 8,709, Jan. 29, 1987, abandoned.

[51] Int. Cl.$^4$ .............................................. B32B 33/00
[52] U.S. Cl. .................................... 156/275.5; 156/99; 156/275.7; 156/327
[58] Field of Search ............... 156/275.3, 275.5, 275.7, 156/99, 100, 106, 332, 327, 331.1; 430/314, 281, 910, 916, 138, 270, 914, 927; 522/25, 26

[56] References Cited

U.S. PATENT DOCUMENTS

| | | | |
|---|---|---|---|
| 2,875,047 | 10/1959 | Oster | 430/281 |
| 3,099,558 | 7/1963 | Leuinos | 522/25 |
| 3,418,118 | 12/1968 | Thommes et al. | 430/281 |
| 3,488,269 | 1/1970 | Allen et al. | 430/286 X |
| 3,495,987 | 2/1970 | Moore | 430/288 X |
| 3,351,281 | 9/1970 | Rust | 430/281 X |
| 3,547,633 | 12/1970 | Rust | 430/328 |
| 3,558,387 | 1/1971 | Bassemir et al. | 156/99 |
| 3,567,453 | 3/1971 | Borden | 430/926 X |
| 3,573,922 | 4/1971 | Rust | 430/286 |
| 3,579,339 | 5/1971 | Chang et al. | 430/926 X |
| 3,615,452 | 10/1971 | Cerwonka | 430/281 X |
| 3,650,927 | 3/1972 | Levinos | 522/26 |
| 3,708,296 | 1/1973 | Schlesinger | 522/25 |
| 3,729,313 | 8/1973 | Smith | 430/332 |
| 3,775,130 | 11/1973 | Enomoto et al. | 430/282 |
| 4,001,017 | 1/1977 | Baumann et al. | 430/281 |
| 4,026,705 | 3/1977 | Crivello et al. | 430/280 |
| 4,109,055 | 8/1978 | Cherenko et al. | 428/437 |
| 4,134,814 | 1/1979 | De Poortese et al. | 204/159.15 |
| 4,153,526 | 5/1979 | Cherenko et al. | 204/159.21 |
| 4,264,703 | 1/1981 | Crivello | 430/270 |
| 4,272,589 | 9/1981 | DuBois et al. | 156/99 |
| 4,307,182 | 8/1981 | Dalzell et al. | 430/339 |
| 4,318,766 | 3/1982 | Smith et al. | 522/25 |
| 4,343,891 | 5/1982 | Aasen et al. | 430/337 |
| 4,355,077 | 10/1982 | Chevreux et al. | 156/99 |
| 4,394,403 | 2/1983 | Smith | 427/42 |
| 4,399,209 | 7/1983 | Sanders et al. | 430/138 |
| 4,405,394 | 9/1983 | Cohen | 156/308.6 |
| 4,423,135 | 12/1983 | Chen et al. | 430/271 |
| 4,450,227 | 12/1984 | Holmes et al. | 430/339 |
| 4,470,858 | 9/1984 | McMaster | 156/103 |
| 4,541,881 | 9/1985 | Sebastiano | 156/99 |
| 4,588,664 | 3/1986 | Fielding et al. | 430/1 |

FOREIGN PATENT DOCUMENTS

| | | |
|---|---|---|
| 147424 | 4/1981 | Fed. Rep. of Germany. |
| 8039162 | 9/1978 | Japan. |
| 567776 | 3/1945 | United Kingdom ............. 156/275.5 |

OTHER PUBLICATIONS

Eaton, "Dye Sensitized Photopolymerization", *Advances in Photochem.*, vol. 13, pp. 427–487.
Kavarnos et al., "Photosensitization by Reversible Electron Transfer: Theories, Experimental Evidence, and Examples", *Chem. Rev.*, 1986, 86, 401, 449.
Chaberek et al., "Dye-Sensitized Photopolymerization Process Kinetics and Mechanis", J. Phys. Chem., 1965, 69, 2842–2848.
Eaton, "Electron Transfer of Induced Photofragmentation as a Route to Free Radicals", *Pure and Applied Chem.*, 56, No. 9, pp. 1191–1202, 1984.
Margerum et al., "Studies on the Mechanism of Dye–Sensitized Photopolymerization Initiation", pp. 634–644.
Nagabhushaman, "Dye-Sensitized Photopolymerization of vinyl Monomers in the Presence of Ascorbic Acid", *g. of Polym. Sci.*, 10, 1511–1528, 1972.
Neumann, "The Photoreduction of Methylene Blue by Arylaminomethane-Sulfonates", Photochem. and Photobio., 39, No. 1, pp. 31–36, 1984.
Foote, "Mechanism of Photosensitized oxidation", *Science*, Nov. 29 1968, vol. 162, No. 3857, pp. 963–970.
Davidson et al., "Photosensitized Oxidation of Amines", *j.c.s. Perkin II*, pp. 169–218.
Sugawara, "Holographic Recording by Dye-Sensitized Photopolymerization of Acrylamide", *Applied Optics*, vol. 14, No. 2, Feb. 1975, pp. 378–382.
Ketley, "Dye-Sensitized Photopolymerization-AR Review", *j. rad. cur.*
Allen et al., "Effect of Viscosity on Dye-Sensitized Free Radical Photopolymerization Processes", *P, S and E*, vol. 9, pp. 148–153.
Margerum, "Photopolymerization Mechanisms", *J. Phys. Chem.*, vol. 75, No. 20, 1971, pp. 3066–3074.
Chang et al., "Color Print Systems Based on Dispersion Photopolymerization", *Photographic Sci. and Eng.*, vol. 13, No. 2, pp. 34, 89 (1969).

*Primary Examiner*—Michael W. Ball
*Assistant Examiner*—David William Herb
*Attorney, Agent, or Firm*—Smith & Schnacke

[57] ABSTRACT

A process for laminating two or more transparent or translucent substrates or one transparent and one opaque substrate together which comprises the steps of: coating a photohardenable composition on one surface of a first translucent substrate, said photohardenable composition comprising a free radical addition polymerizable or crosslinkable compound and a dye-counter ion complex, said complex being capable of absorbing actinic radiation and producing free radicals which initiate free radical polymerization or crosslinking of said compound, and preferably being photobleachable,
applying a second translucent substrate to said photohardenable composition such that said photohardenable composition is interposed between said first translucent substrate and said second translucent substrate, and
exposing said substrates to actinic radiation.

24 Claims, No Drawings

LAMINATING TRANSPARENT OR TRANSLUCENT MATERIALS USING IONIC DYE-COUNTER ION COMPLEXES

This is a (continuation) of application Ser. No. 008,709, filed Jan. 29, 1987 now abandoned.

BACKGROUND OF THE INVENTION

The present invention relates to a process for laminating two or more transparent or translucent substrates or one transparent or translucent and one opaque substrate together. More particularly, the present invention relates to a process for laminating transparent or translucent substrates together using an adhesive which comprises a free radical addition polymerizable composition containing a photobleachable dye-counter ion complex such as a photobleachable cationic dye-borate anion complex or a photobleachable anionic dye-iodonium ion complex as a photoinitiator.

Current photo lamination techniques for glass and similar substrates involve bonding thin translucent layers together with a thermally cured adhesive. Photocrosslinkable and photopolymerizable adhesives have not been used extensively because the adhesives which have been available commercially employ UV initiators. Glass and plastic substrates tend to absorb heavily in the UV range making it impractical to use most UV sensitive adhesives.

SUMMARY OF THE INVENTION

It has been found that dye-counter ion complexes are useful visible light initiators for free radical addition reactions. The present invention provides a process for laminating two or more transparent or translucent substrates together using an adhesive which comprises a free radical addition polymerizable composition containing a photobleachable dye-counter ion complex as a visible light initiator. Thus, the present invention provides a process which eliminates the disadvantages of ultraviolet and thermal initiators in laminating glass and similar substrates.

Thus, the present invention provides a means for generating free radicals from the singlet state of an excited dye, and in so doing, provides visible light hardenable compositions which are useful as adhesives in laminating two or more transparent or translucent substrates together or a transparent or translucent substrate and an opaque substrate.

A particular advantage of using dye-counter ion complexes as initiators of free radical addition reactions for adhesives for glass lamination is the ability to select from a wide variety of dyes which absorb at substantially different wavelengths. The absorption characteristics of the complex are principally determined by the dye. Thus, by selecting a dye which absorbs at 400 nm or greater, the sensitivity of the photosensitive material can be extended well into the visible range and by selecting a dye which is bleached upon exposure a laminate can be obtained which is essentially as transparent as the substrate lamina.

The principal object of the present invention is to provide free radical addition polymerizable compositions containing a photobleachable dye-counter ion complex as a photoinitiator which are useful as adhesives in laminating transparent or translucent substrates.

A further object of the present invention is to provide visible light-sensitive photohardenable compositions which are useful as adhesives in laminates.

Another object of the present invention is to provide photohardenable compositions for use as adhesives in transparent or translucent laminates which eliminate the need for exposure to ultraviolet radiation or heat.

These and other objects are accomplished in accordance with the present invention which, in one embodiment, provides a process for laminating transparent or translucent substrates which comprises the steps of:

coating a photohardenable composition on one surface of a first substrate, said photohardenable composition comprising a free radical addition polymerizable or crosslinkable compound and a dye-counter ion complex, said complex being capable of absorbing actinic radiation and producing free radicals which initiate free radical polymerization or crosslinking of said compound, applying a second substrate to said photohardenable composition to form a laminate in which said photohardenable composition is interposed between said first and said second substrates, and exposing said laminate to actinic radiation; at least one of said first and second substrates being transparent or translucent.

Another embodiment of the present invention resides in a process for laminating a glass substrate which comprises the steps of:

coating a photohardenable composition on one surface of a first substrate, said photohardenable composition comprising a free radical addition polymerizable or crosslinkable compound and a dye-counter ion complex, said complex being capable of absorbing actinic radiation and producing free radicals which initiate free radical polymerization or crosslinking of said compound, applying a second substrate to said photohardenable composition to form a laminate in which said photohardenable composition is interposed between said first and said second substrates, and exposing said laminate to actinic radiation; at least one of said first and second substrates being glass.

In accordance with the more particular embodiments of the invention, the dye complex is a cationic dye-borate anion complex or an anionic dye-counter ion complex. More particularly, the dye complex is a cyanine dye-borate anion complex or an anionic dye complex such as complexes of xanthene dyes with iodonium or phosphonium ions.

DETAILED DESCRIPTION OF THE INVENTION

The process of the present invention is useful for laminating transparent or translucent substrates. Examples of useful substrates include glass and transparent or translucent polymeric films such as polyethylene terephthalate films, polycarbonate, mylar film or laminates of protective films and glass. The process of the present invention is particularly useful in laminating window glass and plate glass.

Ionic dye-counter ion complexes useful in the present invention are described in U.S. Application Ser. No. 944,305 filed December 18, 1986 (Attorney's docket MDX 188 P2) now U.S. Pat. No. 4,772,530 which is incorporated herein by reference.

Such compounds consist of a visible light absorber (the ionic dye) ionically bonded to a reactive counter ion. The counter ion is reactive in the sense that upon excitation of the dye the counter ion donates an electron to or accepts an electron from the excited dye. This electron transfer process generates radicals capable of initiating polymerization of a monomer.

The ionic compounds used in the present invention are different than the collision generated species encountered in other photosensitive systems such as collision complexes which yield encounter complexes, exciplexes and/or contact ion pairs. See for example, Kavarnos, George J. and Turro, Nicholas J., "Photosensitization by Reversible Electron Transfer", *Chem. Rev.* 1986, 401–449.

In accordance with the present invention the ionic dye and the counter ion are present in the photopolymerizable composition as a stable, non-transient compound, and not as a dissociated ion pair. Formation of the compound is not dependent upon diffusion and collision. As distinguished from photographic materials and compositions containing collision dependent complexes essentially all of the sensitizing dye present in the photosensitive materials of the present invention prior to exposure is ionically bonded to the the counter ion.

The ionic compounds used as initiators in the present invention can also be characterized in that they are typically soluble in nonpolar solvents such as TMPTA and the like. They are soluble in an amount of at least about 0.1% and preferably at least about 0.3% by weight. While these amounts are not large, they are substantial the normally lower solublity of ionic materials in polar solvents. While the compounds are soluble, the dye and the counter ion do not dissociate in solution. They remain ionically bonded to each other.

In dye-sensitized photopolymerizable compositions, visible light is absorbed by a dye having a comparable absorption band, the dye is raised to its excited electronic state, the lifetime of which may be $10^{-9}$ to $10^{-3}$ second, depending upon the nature (singlet or triplet) of the excited state. During this time, absorbed energy can be utilized to promote electron transfer to or from the dye molecule to produce the free radical. In prior initiator systems, this transfer is diffusion controlled. The excited dye must interact (collide) with another molecule in the composition which quenches the dye and generates a free radical. In the present invention, the transfer is not diffusion (collision) controlled. Electron transfer occurs at greater than diffusion controlled rates. In terms of Stern-Volmer kinetics, this means the quenching constant (Kq) of the excited dye is greater than $10^{10}$ and, more particularly, greater than $10^{12}$. At these rates, electron transfer can occur through the singlet state.

Thus, the present invention provides a means for generating free radicals from the excited state of an ionic dye and insodoing provides photohardenable compositions which are sensitive at longer wavelengths.

One of the particular advantages of using ionic dye-counter ion compounds as initiators of free radical addition reactions is the ability to select from a wide variety of dyes which absorb at substantially different wavelengths. The absorption characteristics of the compound are principally determined by the dye. Thus, by selecting a dye which absorbs at 400 nm or greater, the sensitivity of the photosensitive material can be extended well into the visible range.

Cationic dye-borate anion compounds are known in the art. Their preparation and use in imaging systems is described in U.S. Pat. Nos. 3,567,453; 4,307,182; 4,343,891; 4,447,521; and 4,450,227. The compounds used in the present invention can be represented by the general formula (I):

where D+ is a cationic dye; and $R^1$, $R^2$, $R^3$, and $R^4$ are independently selected from the group consisting of alkyl, aryl, alkaryl, allyl, aralkyl, alkenyl, alkynyl, alicyclic and saturated or unsaturated heterocyclic groups.

Useful dyes form photoreducible but dark stable complexes with borate anions and can be cationic methine, polymethine, triarylmethane, indoline, thiazine, xanthene, oxazine and acridine dyes. More specifically, the dyes may be cationic cyanine, carbocyanine, hemicyanine, rhodamine and azomethine dyes. In addition to being cationic, the dyes are preferably photobleachable. Furthermore, the dyes should not contain groups which would neutralize or desensitize the complex or render the complex poorly dark stable. Examples of groups which generally should not be present in the dye are acid groups such as free carboxylic or sulphonic acid groups.

Specific examples of useful cationic dyes are Methylene Blue, Safranine O, Malachite Green, cyanine dyes of the general formula (II) and rhodamine dyes of the formula (III):

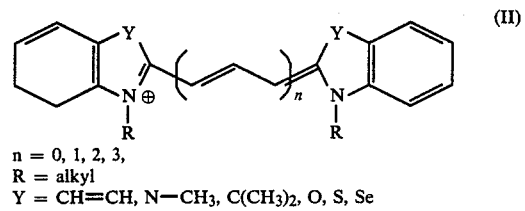

n = 0, 1, 2, 3,
R = alkyl
Y = CH=CH, N—CH3, C(CH3)2, O, S, Se

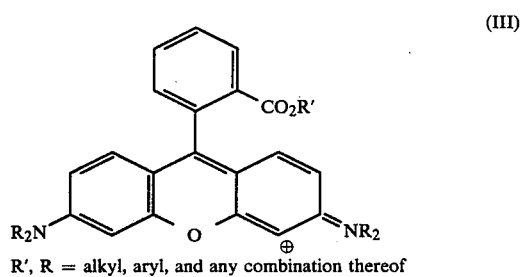

R', R = alkyl, aryl, and any combination thereof

While they have not been tested, the cationic cyanine dyes disclosed in U.S. Patent 3,495,987 should be useful in the present invention.

The borate anion is designed such that the borate radical generated upon exposure to light and after electron transfer to the dye (Eq. 1) readily dissociates with the formation of a radical as follows:

For example particularly preferred anions are triphenylbutylborate and trianisylbutylborate anions because they readily dissociate to triphenylborane or trianisylborane and a butyl radical.

Preferably, at least one but not more than three of $R^1$, $R^2$, $R^3$, and $R^4$ is an alkyl group. Each of $R^1$, $R^2$, $R^3$, and $R^4$ can contain up to 20 carbon atoms, and they typically contain 1 to 7 carbon atoms. More preferably $R^1$-$R^4$ are a combination of alkyl group(s) and aryl group(s) or aralkyl group(s) and still more preferably a combination of three aryl groups and one alkyl group.

Representative examples of alkyl groups represented by $R^1$-$R^4$ are methyl, ethyl, propyl, butyl, pentyl, hexyl, octyl, stearyl, etc. The alkyl groups may be substituted, for example, by one or more halogen, cyano, acyloxy, acyl, alkoxy or hydroxy groups.

Representative examples of aryl groups represented by $R^1$-$R^4$ include phenyl, naphthyl and substituted aryl groups such as anisyl. Alkaryl groups include methylphenyl, dimethylphenyl, etc. Representative examples of aralkyl groups represented by $R^1$-$R^4$ groups include benzyl. Representative alicyclic groups include cyclobutyl, cyclopentyl, and cyclohexyl groups. Examples of an alkynyl group are propynyl and ethynyl, and examples of alkenyl groups include a vinyl group.

As a general rule, useful ionic dye compounds must be identified empirically, however, potentially useful dye and counter ion combinations can be identified by reference to the Weller equation (Rehm, D. and Weller, A., *J Chem.* (1970), 8, 259–271), which can be simplified as follows.

$$\Delta G = E_{ox} - E_{red} - E_{hv} \quad \text{(Eq. 3)}$$

where $\Delta G$ is the change in the Gibbs free energy, $E_{ox}$ is the oxidation potential of the borate anion $BR^-_4$, $E_{red}$ is the reduction potential of the cation: dye, and $E_{hv}$ the energy of light used to excite the dye. Useful compounds will have a negative free energy change. Similarly, the difference between the reduction potential of the dye and the oxidation potential of the borate must be negative for the compounds to be dark stable, i.e., Eox - Ered > 0.

As indicated, Eq. 2 is a simplification and it does not absolutely predict whether a compound will be useful in the present invention or not. There are a number of other factors which will influence this determination. One such factor is the effect of the monomer on the compound. Another factor is the radial distance between the ions. It is also known that if the Weller equation produces too negative a value, deviations from the equation are possible. Furthermore, the Weller equation only predicts electron transfer, it does not predict whether a particular compound is an efficient initiator of polymerization. The equation is a useful first approximation.

Specific examples of cationic dye-borate anion compounds useful in the present invention are shown in the following table with their λ max.

TABLE

| Compound No. | Structure | λmax (TMPTA) |
|---|---|---|
| 1. | (benzothiazole dye with CH₃ bridge, N-CH₂CH₃ groups) Ph₃B⊖n-C₄H₉ | 552 nm |
| 2. | (benzothiazole dye, N-C₇H₁₅ groups) Ph₃B⊖n-C₄H₉ | 568 nm |
| 3. | (benzoxazole dye, N-n-C₆H₁₃ groups) Ph₃B⊖n-C₄H₉ | 492 nm |
| 4. | (benzothiazole dye, N-CH₃ groups) Ph₃B⊖n-C₄H₉ | 428 nm |
| 5. | (phenothiazine dye, (CH₃)N...N(CH₃)₂) Ph₃B⊖n-C₄H₉ | 658 nm |

TABLE-continued
| | | |
|---|---|---|
| 6. | 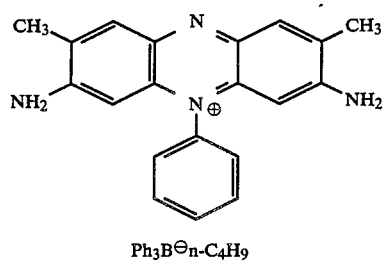 | 528 nm |
| 7. | 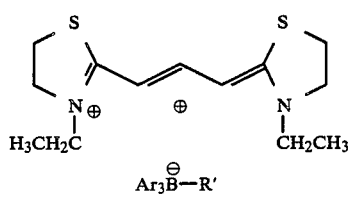 | 450 nm |
| No. | R' | Ar |
|---|---|---|
| 7A | n-butyl | phenyl |
| 7B | n-hexyl | phenyl |
| 7C | n-butyl | anisyl |
| | | |
|---|---|---|
| 8. | 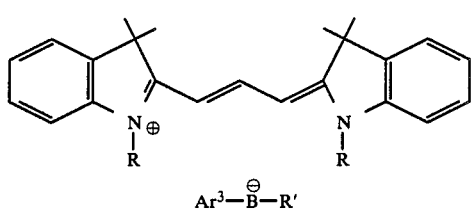 | 550 nm |
| No. | R' | R | Ar |
|---|---|---|---|
| 8A | methyl | n-butyl | phenyl |
| 8B | methyl | n-hexyl | phenyl |
| 8C | n-butyl | n-butyl | phenyl |
| 8D | n-butyl | n-hexyl | phenyl |
| 8E | n-heptyl | n-butyl | phenyl |
| 8F | n-heptyl | n-hexyl | phenyl |
| 8G | ethyl | n-butyl | phenyl |
| | | |
|---|---|---|
| 9. | 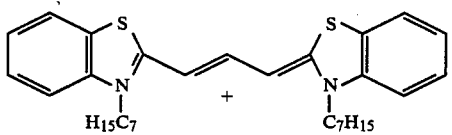<br>+<br>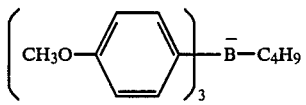 | 570 nm System |
| 10. | 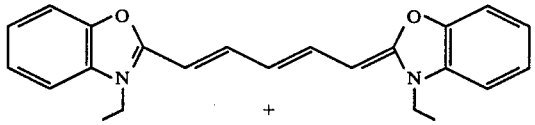<br>+<br>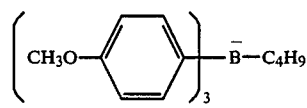 | 590 nm System |

TABLE-continued

11. 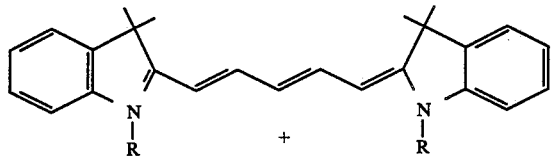 640 nm

Ar₃B⁻—R'

| No. | R | R' | Ar |
|---|---|---|---|
| 11A | methyl | n-butyl | phenyl |
| 11B | methyl | n-hexyl | phenyl |
| 11C | n-butyl | n-butyl | phenyl |
| 11D | n-butyl | n-hexyl | phenyl |
| 11E | n-pentyl | n-butyl | phenyl |
| 11F | n-pentyl | n-hexyl | phenyl |
| 11G | n-heptyl | n-butyl | phenyl |
| 11H | n-heptyl | n-hexyl | phenyl |
| 11I | methyl | n-butyl | anisyl |

12. 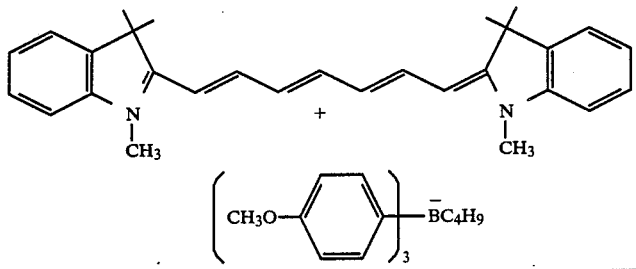 740 nm System

The cationic dye-borate anion compounds can be prepared by reacting a borate salt with a dye in a counter ion exchange in a known manner. See Hishiki, Y., Repts. *Sci. Research Inst.* (1953), 29, pp 72–79. Useful borate salts are sodium salts such as sodium tetraphenylborate, sodium triphenylbutylborate, sodium trianisylbutylborate and ammonium salts such as tetraethylammonium tetraphenylborate.

Anionic dye compounds are also useful in the present invention. Anionic dye-iodonium ion compounds of the formula (IV):

$$[R^5\text{—I—}R^6]_n\, D^{-n} \quad (IV)$$

where $D^{-n}$ is an anionic dye and $R^5$ and $R^6$ are independently selected from the group consisting of aromatic nucleii such as phenyl or naphthyl and n is 1 or 2; and anionic dye-pyryllium compounds of the formula (V):

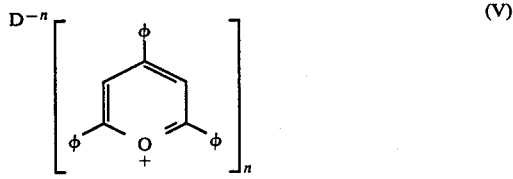 (V)

where $D^{-n}$ and n are as defined above are typical examples of anionic dye complexes.

Representative examples of anionic dyes include xanthene and oxonol dyes. For example Rose Bengal, eosin, erythrosin, and fluorscein dyes are useful. In addition to iodonium and pyryllium ions, other compounds of anionic dyes and sulfonium and phosphonium cations are potentially useful.

As in the case of the cationic dye compounds, useful dye-cation combinations can be identified through the Weller equation as having a negative free energy.

Selected examples of anionic dye compounds are shown in Table 2λ max. ca. 570 nm in TMPTA. In Table 2 the symbol φ is used for a phenyl group and the structure

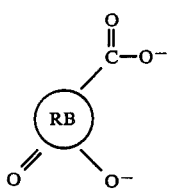

is used for

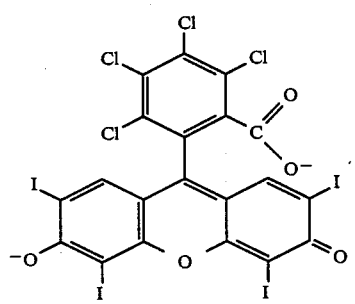

TABLE 2

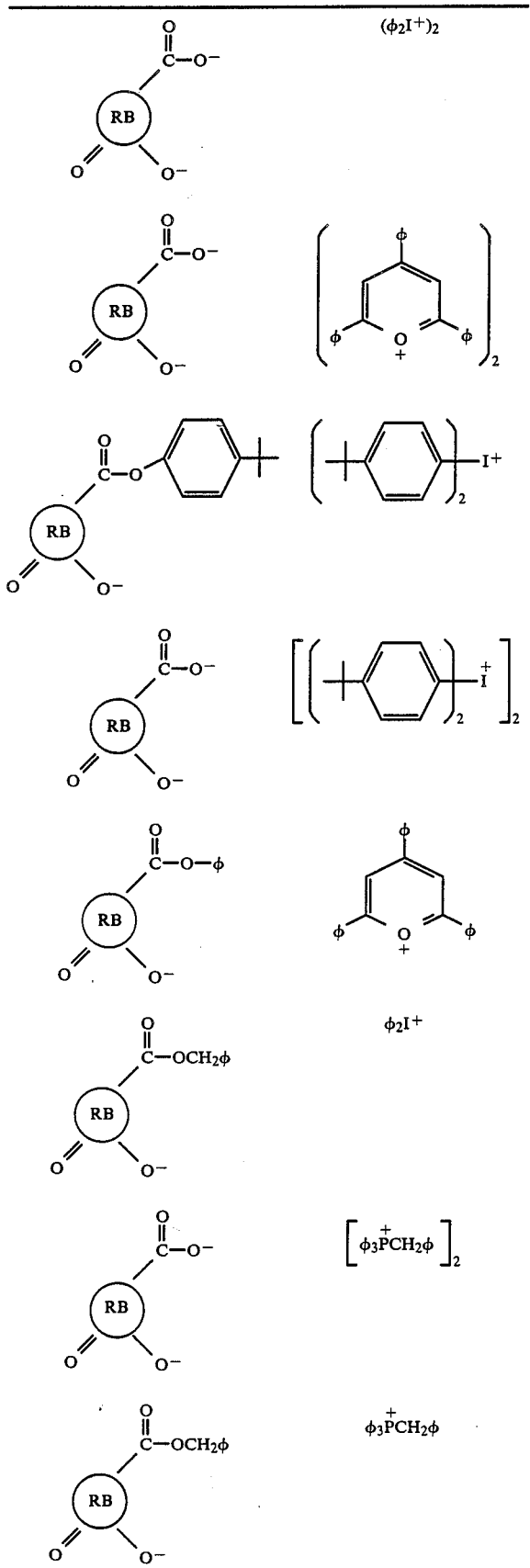

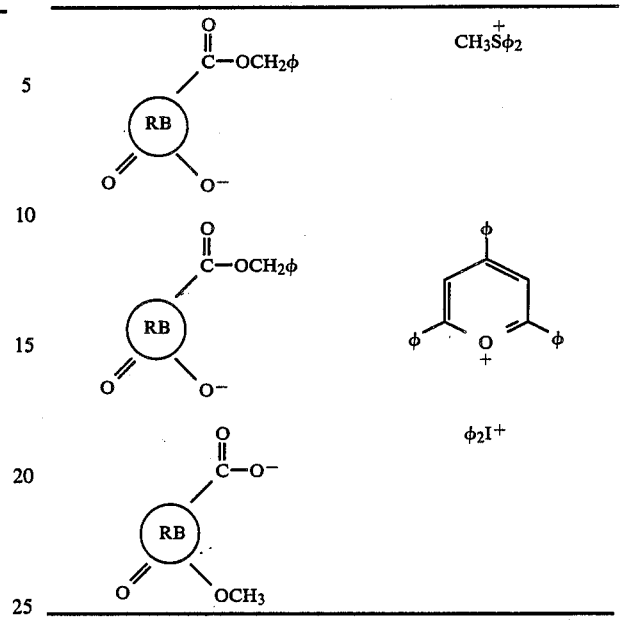

The most typical examples of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanedioll, 6-dimethacrylate, and diethyleneglycol dimethacrylate.

The ionic dye compound is usually used in an amount up to about 1% by weight based on the weight of the photopolymerizable or crosslinkable species in the photohardenable composition. More typically, the compound is used in an amount of about 0.2% to 0.5% by weight.

While the compound can be used alone as the initiator, film speeds tend to be quite low and oxygen inhibition is observed. It has been found that it is preferable to use the compound in combination with an autoxidizer. An autoxidizer is a compound which is capable of consuming oxygen in a free radical chain process.

Examples of useful autoxidizers are N,N-dialkylanilines. Examples of preferred N,N-dialkylanilines are dialkylanilines substituted in one or more of the ortho-, meta-, or paraposition by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylsilyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo.

Representative examples of N,N-dialkylanilines useful in the present invention are 4-cyano-N, N-dimethylaniline, 4-acetyl-N,N-dimethylaniline, 4-bromo-N, N-dimethylaniline, ethyl 4-(N,N-dimethylamino) benzoate, 3-chloro-N,N-dimethylaniline, 4-chloro-N,N-dimethylaniline, 3-ethoxy-N,N-dimethylaniline, 4-fluoro- N,N-dimethylaniline, 4-methyl-N,N-dimethylaniline, 4-ethoxy-N,N-dimethylaniline, N,N-dimethylthioanicidine, 4-amino-N,N-dimethylaniline, 3-hydroxy-N,N-dimethylaniline, N,N,N',N'-tetramethyl-1,4- dianiline, 4-acetamido-N, N-dimethylaniline, etc.

Preferred N,N-dialkylanilines are substituted with an alkyl group in the ortho-position and include 2,6- diisopropyl-N,N-dimethylaniline, 2,6-diethyl-N,N-dimethylaniline, N,N,2,4,6-pentamethylaniline (PMA) and p-t-butyl-N,N-dimethylaniline.

The autoxidizers are preferably used in the present invention in concentrations of about 4–5% by weight.

Because the complexes absorb at wavelengths greater than 400 nm, they are colored during the initial exposure to actinic radiation. However, to be acceptable for use in the present invention, the complex must be bleached essentially transparent with prolonged exposure to visible light or ambient ultraviolet radiation (e.g., sunlight).

The photohardenable compositions of the present invention can be coated on the first transparent or translucent substrate in a conventional manner. Typical coating means include brushing, spray coating, roll coating, blade coating, etc. The coating thickness is about 1 to 20 microns, with a preferred thickness of 5 to 10 microns.

In some cases it may be desirable to adjust the viscosity of the adhesive to facilitate obtaining a smooth even coating free from entrapped air bubbles or the like. The viscosity of the composition can be adjusted through the addition of inert diluents such as propylene carbonate or through the use of monomer blends.

After coating the photohardenable composition on one surface of a first substrate, a second substrate is applied to the photohardenable composition so that the photohardenable composition is interposed between the first substrate and the second substrate. The three layer structure is then exposed to light.

When complete transparency is desired the dye must be photobleachable, i.e., it must be bleached to an essentially colorless condition upon exposure to visible light or sunlight. Where a tinted effect is desirable, the photobleachability of the dye would not be required. Thus, while the process of the present invention will typically require the use of dye complexes containing photobleachable dyes, it is not limited to this and it is open to the use of non-bleachable complexes in those applications in which transparency is not required.

Having described the invention in detail and by reference to preferred embodiments thereof, it will be apparent that modifications and variations are possible without departing from the scope of the invention defined in the appended claims.

What is claimed is:

1. A process for laminating a transparent or translucent substrate which comprises the steps of:
   coating a photohardenable composition on one surface of a first substrate, said photohardenable composition comprising a free radical addition polymerizable or crosslinkable compound and a dye-reactive counter ion complex, said complex being capable of absorbing actinic radiation and producing free radicals which initiate free radical polymerization or crosslinking of said compound and being a stable non-transcient compound prior to actinic radiation,
   applying a second substrate to said photohardenable composition to form a laminate in which said photohardenable composition is interposed between said first and said second substrate, and
   exposing said laminate to actinic radiation; at least one of said substrates being transparent or translucent.

2. The process of claim 1 wherein said complex is photobleachable.

3. The process of claim 2 wherein said complex is a cationic dye-borate anion complex.

4. The process of claim 3 wherein said cationic dye-borate anion complex is represented by the formula:

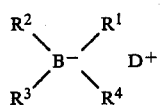

where $D^+$ is a cationic dye moiety and $R^1$, $R^2$, $R^3$ and $R^4$ are the same or different and selected from the group consisting of alkyl, aryl, aralkyl, alkaryl, alkenyl, alkynyl, alicyclic, heterocyclic, and allyl groups.

5. The process of claim 4 wherein said cationic dye is selected from the group consisting of cationic methine, polymethine, triarylmethane, indoline, thiazine, xanthene, oxazine, and acridine dyes.

6. The process of claim 5 wherein said compound is an ethylenically unsaturated compound.

7. The process of claim 2 wherein said complex is an anionic dye complex.

8. The process of claim 7 wherein said anionic dye is selected from the group consisting of xanthene and oxonol dyes.

9. The process of claim 8 wherein said complex is an anionic dye-iodonium ion complex or an anionic dye-pyryllium ion complex.

10. A process for laminating a glass substrate which comprises the steps of:
    coating a photohardenable composition on one surface of a first substrate, said photohardenable composition comprising a free radical addition polymerizable or crosslinkable compound and a dye-reactive counter ion complex, said complex being capable of absorbing actinic radiation and producing free radicals which initiate free radical polymerization or crosslinking of said compound and being a stable non-transcient compound prior to exposure to actinic radiation,
    applying a second substrate to said photohardenable composition such that said photohardenable composition is interposed between said first substrate and said second substrate, and
    exposing said substrates to actinic radiation; wherein at least one of said substrate is glass.

11. The process of claim 10 wherein said ionic dye-counter ion complex is photobleachable.

12. The process of claim 11 wherein said complex is a cationic dye-borate anion complex.

13. The process of claim 12 wherein said cationic dye-borate anion complex is represented by the formula:

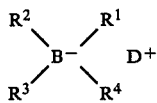

where D+ is a cationic dye moiety and $R^1$, $R^2$, $R^3$ and $R^4$ are the same or different and selected from the group consisting of alkyl, aryl, aralkyl, alkaryl, alkenyl, alkynyl, alicyclic, heterocyclic, and allyl groups.

14. The process of claim 13 wherein said cationic dye is selected from the group consisting of cationic methine, polymethine, triarylmethane, indoline, thiazine, xanthene, oxazine, and acridine dyes.

15. The process of claim 14 wherein said compound is an ethylenically unsaturated compound.

16. The process of claim 11 wherein said complex is an anionic dye complex.

17. The process of claim 16 wherein said anionic dye is selected from the group consisting of xanthene and oxonol dyes.

18. The process of claim 17 wherein said complex is an anionic dye-iodonium ion complex or an anionic dye-pyryllium ion complex.

19. The process of claim 1 wherein at least one of said substrates is a transparent or translucent polymeric film.

20. The process of claim 10 wherein said first and said second substrates are glass.

21. The process of claim 1 wherein said dye-reactive counter ion complex is soluble in non-polar solvents in an amount of at least 0.1%.

22. The process of claim 10 wherein said dye-reactive counter ion complex is soluble in non-polar solvents in an amount of at least 0.1%.

23. The process of claim 1 wherein said actinic radiation is visible light.

24. The process of claim 10 wherein said actinic radiation is visible light.

* * * * *